(12) United States Patent
Canfield et al.

(10) Patent No.: US 7,505,251 B2
(45) Date of Patent: Mar. 17, 2009

(54) ACTUATION MECHANISM FOR MATING ELECTRONIC CARD INTERCONNECT SYSTEMS

(75) Inventors: Shawn M. Canfield, Poughkeepsie, NY (US); John J. Loparco, Poughkeepsie, NY (US); Emanuele F. Lopergolo, Marlboro, NY (US); Budy D. Notohardjono, Poughkeepsie, NY (US); Michael T. Peets, Staatsburg, NY (US); John G. Torok, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 397 days.

(21) Appl. No.: 11/262,047

(22) Filed: Oct. 28, 2005

(65) Prior Publication Data

US 2007/0097605 A1    May 3, 2007

(51) Int. Cl.
*G06F 1/16* (2006.01)
(52) U.S. Cl. ................................... 361/679; 361/727
(58) Field of Classification Search ............. 361/679, 361/683, 685, 724, 725, 726, 727, 728, 729, 361/730, 731, 732, 733, 740, 741, 754, 755, 361/756, 759, 798, 801; 211/26, 151, 166; 312/294, 330.1, 331, 334.1, 334.4, 334.16, 312/334.8, 319.8, 333
See application file for complete search history.

(56) References Cited

U.S. PATENT DOCUMENTS

| | | | |
|---|---|---|---|
| 3,603,660 A | * 9/1971 | Weltha | 312/333 |
| 3,730,605 A | 5/1973 | Eckerd | 312/257 |
| 3,733,523 A | 5/1973 | Reynolds et al. | 317/101 |
| 3,807,572 A | 4/1974 | Luvara et al. | 211/10 |
| 3,971,186 A | * 7/1976 | Havelka et al. | 403/374.4 |
| 4,067,632 A | * 1/1978 | Sekerich | 312/334.9 |
| 4,318,157 A | * 3/1982 | Rank et al. | 361/704 |
| 4,354,770 A | * 10/1982 | Block | 361/801 |
| 4,480,287 A | * 10/1984 | Jensen | 361/715 |
| 4,615,276 A | 10/1986 | Garabedian | 108/61 |
| 4,751,963 A | * 6/1988 | Bui et al. | 361/704 |
| 4,819,713 A | 4/1989 | Weisman | 361/707 |
| 4,823,951 A | * 4/1989 | Colomina | 439/59 |
| 4,824,303 A | * 4/1989 | Dinger | 411/79 |
| 4,971,570 A | * 11/1990 | Tolle et al. | 361/709 |
| 5,036,428 A | 7/1991 | Brownhill et al. | 361/721 |
| 5,071,013 A | * 12/1991 | Peterson | 211/26 |
| 5,090,840 A | * 2/1992 | Cosenza | 361/759 |
| 5,130,887 A | 7/1992 | Trelford | 361/380 |
| 5,156,647 A | * 10/1992 | Ries | 411/24 |

(Continued)

FOREIGN PATENT DOCUMENTS

CN    2276242 Y    3/1998

*Primary Examiner*—Anatoly Vortman
*Assistant Examiner*—Adrian S Wilson
(74) *Attorney, Agent, or Firm*—Lily Neff

(57) ABSTRACT

An actuation assembly and method is provided for mating electronic unto a computer rack comprising a main housing engageably securable to a slide assembly. The slide assembly is capable of being secured to a side of the computer rack and having sliding features such that the slide assembly and the main housing when engaged can be telescoped out or returned to a closed position. The main housing having a vertical wedge for securing said assembly to said rack more securely and a drive wedge for moving the vertical wedge such that it can telescope into and out of said rack with said slide mechanism via a lead screw.

17 Claims, 4 Drawing Sheets

U.S. PATENT DOCUMENTS

| | | | | |
|---|---|---|---|---|
| 5,162,845 A * | 11/1992 | Ariyama et al. | | 361/727 |
| 5,220,485 A * | 6/1993 | Chakrabarti | | 361/720 |
| 5,224,016 A * | 6/1993 | Weisman et al. | | 361/729 |
| 5,262,587 A * | 11/1993 | Moser | | 361/711 |
| 5,290,122 A * | 3/1994 | Hulme | | 403/409.1 |
| 5,407,297 A * | 4/1995 | Hulme et al. | | 403/24 |
| 5,472,353 A * | 12/1995 | Hristake et al. | | 361/709 |
| 5,483,420 A * | 1/1996 | Schiavini | | 361/719 |
| 5,485,353 A * | 1/1996 | Hayes et al. | | 361/726 |
| 5,779,388 A * | 7/1998 | Yamamoto | | 361/741 |
| 5,859,764 A * | 1/1999 | Davis et al. | | 211/41.17 |
| 5,934,485 A | 8/1999 | Harris et al. | | 211/26 |
| 5,954,122 A * | 9/1999 | Sittig | | 361/721 |
| 6,007,358 A * | 12/1999 | Nagase | | 361/727 |
| 6,212,075 B1 * | 4/2001 | Habing et al. | | 361/719 |
| 6,230,903 B1 * | 5/2001 | Abbott | | 312/334.4 |
| 6,246,582 B1 * | 6/2001 | Habing et al. | | 361/719 |
| 6,272,016 B1 * | 8/2001 | Matonis et al. | | 211/41.17 |
| 6,285,564 B1 * | 9/2001 | O'Brien | | 361/759 |
| 6,466,449 B1 | 10/2002 | Sheen et al. | | 361/752 |
| 6,615,997 B2 * | 9/2003 | Danello et al. | | 211/26 |
| 6,629,614 B2 | 10/2003 | Jordan | | 211/26 |
| 6,681,942 B2 * | 1/2004 | Haney | | 211/26 |
| 6,948,691 B2 * | 9/2005 | Brock et al. | | 312/333 |
| 6,988,626 B2 * | 1/2006 | Varghese et al. | | 312/334.4 |
| 7,137,512 B2 * | 11/2006 | Nguyen et al. | | 211/26 |
| 7,316,461 B2 | 1/2008 | Wyatt et al. | | 312/352 |
| 2001/0037985 A1 * | 11/2001 | Varghese et al. | | 211/26 |
| 2003/0048618 A1 * | 3/2003 | Adams et al. | | 361/740 |
| 2003/0146176 A1 * | 8/2003 | Danello et al. | | 211/26 |
| 2005/0206284 A1 * | 9/2005 | Dubon et al. | | 312/333 |

* cited by examiner

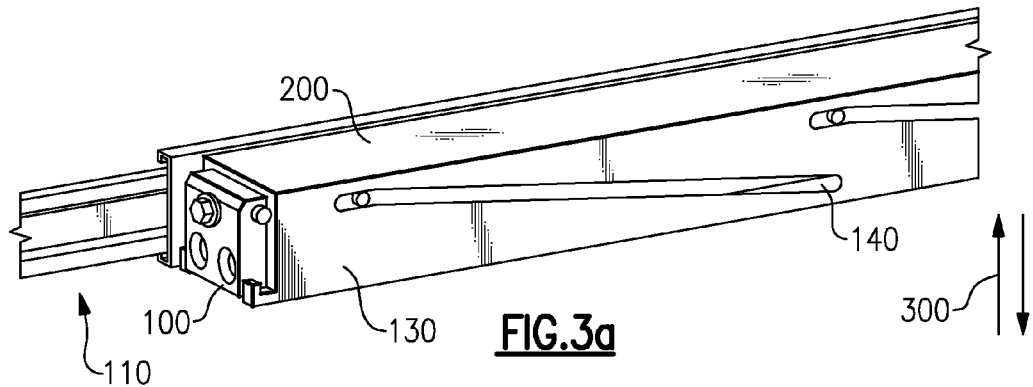
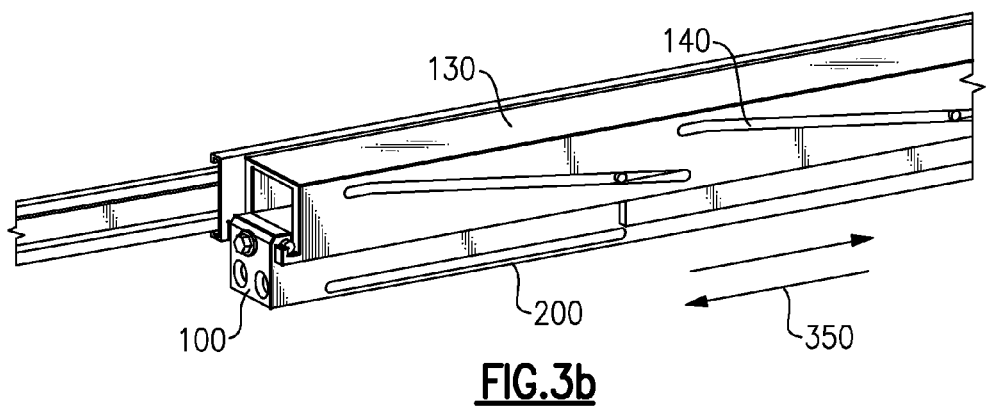
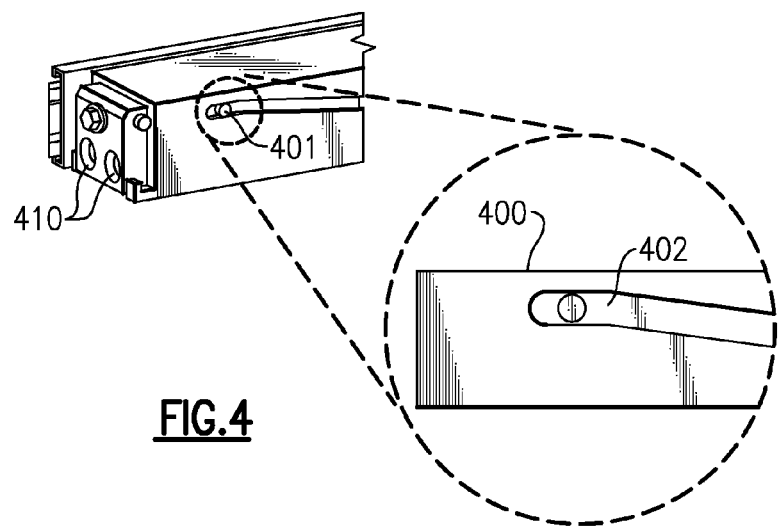

ACTUATION MECHANISM FOR MATING ELECTRONIC CARD INTERCONNECT SYSTEMS

CROSS-REFERENCE TO RELATED APPLICATIONS

This application contains subject matter which is related to the subject matter of the following co-pending applications, filed on the same day, which is assigned to the same assignee as this application, International Business Machines Corporation of Armonk, N.Y. Each of the below listed applications is hereby incorporated herein by reference in its entirety: Ser. Nos. 11/262,051 and 11/262,050.

TRADEMARKS

IBM® is a registered trademark of International Business Machines Corporation, Armonk, N.Y., U.S.A. S/390, Z900 and z990 and other names used herein may be registered trademarks, trademarks or product names of International Business Machines Corporation or other companies.

BACKGROUND OF THE INVENTION

1. Field of the Invention

This invention relates to packaging of computing systems and more particularly to packaging of large computing systems that include one or more central electronic complexes (CECs).

2. Description of Background

Increased packaging density continues to challenge the computer system developers. This is true of all computing system environments, whether they are comprised of a single small unit or a plurality of systems networked to one another. In large and complex system environments, however, these problem associated with increased density become even more of a concern. This is because in more complex environments, the size of the environment multiplies the number of issues to be resolved. In addition, in large environments resolution of all problems, even seemingly isolated ones, are codependent on other existing factors in the environment, especially when different components in the environment are packaged together in a single assembly or networked in close proximity. Consequently, the designers of such environments are faced with increasingly difficult challenges, especially where the design requires the environment to be housed in a predefined system footprint. Two of the more difficult challenges to resolve are the issues of heat dissipation and structural integrity of the environment.

The designers of computing environments have utilized unique approaches in order to maximize air-cooling capabilities within a predefined system footprint. This requirement results from the heat dissipated from packages residing in large computing systems and how it affects the computing system's internal areas adjacent to heat producing components that can affect both electrical and structural integrity of the system as a whole. In addition, many large computing environments incorporate one or more large central electronic complexes (CECs) to support logic entities, such as daughter cards, modules and the like, whereby mid-plane boards have historically been vertically mounted (in reference with the ground plane).

Unfortunately, in such systems, the designs that address structural rigidity issues of the environment do not always provide an acceptable solution to the challenges posed by heat dissipation. This is because in such designs, the mid-plane orientation within the CEC is particularly important in minimizing adverse dynamic loading effects. In doing so, however, the configuration orientation impedes efficient-air cooling approaches, such as the simple front to back cooling using an omega form air flow pattern.

Current prior art solutions are not able to address the many problems that challenges, such as that of heat dissipation and dynamic loading effects of such large computing environments in a single design. Therefore, it is desirous to have an assembly that addresses actuation, structural issues and dynamic loading issues of the current systems without affecting thermal management and other seemingly isolated issues that have a great impact on one another and the overall performance of any large computing system environment, especially those that include one or more CECs.

SUMMARY OF THE INVENTION

The shortcomings of the prior art are overcome and additional advantages are provided through the provision of a method and incorporated assembly provided for mating electronic unto a computer rack comprising a main housing engageably securable to a slide assembly. The slide assembly is capable of being secured to a side of the computer rack and having sliding features such that the slide assembly and the main housing when engaged can be telescoped out or returned to a closed position. The main housing having a vertical wedge for securing said assembly to said rack more securely and a drive wedge for moving the vertical wedge such that it can telescope into and out of said rack with said slide mechanism via a lead screw.

In one embodiment of the present invention, the slide mechanisms further comprise a fixed housing and a sliding feature moveably engaged to this housing such that said sliding feature can move from a first position to a second position to provide telescoping feature for the mechanism.

In another embodiment a dwell feature is provided. To accomplish the dwell feature, the vertical wedge and/or the housing are formed such that they accommodate a connector system. A variety of different connector systems can be conceived but in a preferred embodiment, the connector system comprises of a pin and hole feature where the amount of movement of the dwell feature is dependent on the pin and hole relationship of the housing and the vertical wedge.

In an alternate embodiment, one or more stiffening member(s) can be connected to the assembly in areas surrounding the surface-mount interconnect, such as the mid-plane connector area of a large computing environment. In addition guidance mechanism can also be provided to provide a better connection.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIGS. 3a and 3b are detailed illustrations of the actuation mechanism as per one embodiment of the present invention;

FIG. 4 is a detailed illustration showing the wedge mechanism as per one embodiment of the present invention;

DESCRIPTION OF THE INVENTION

Figure 1:
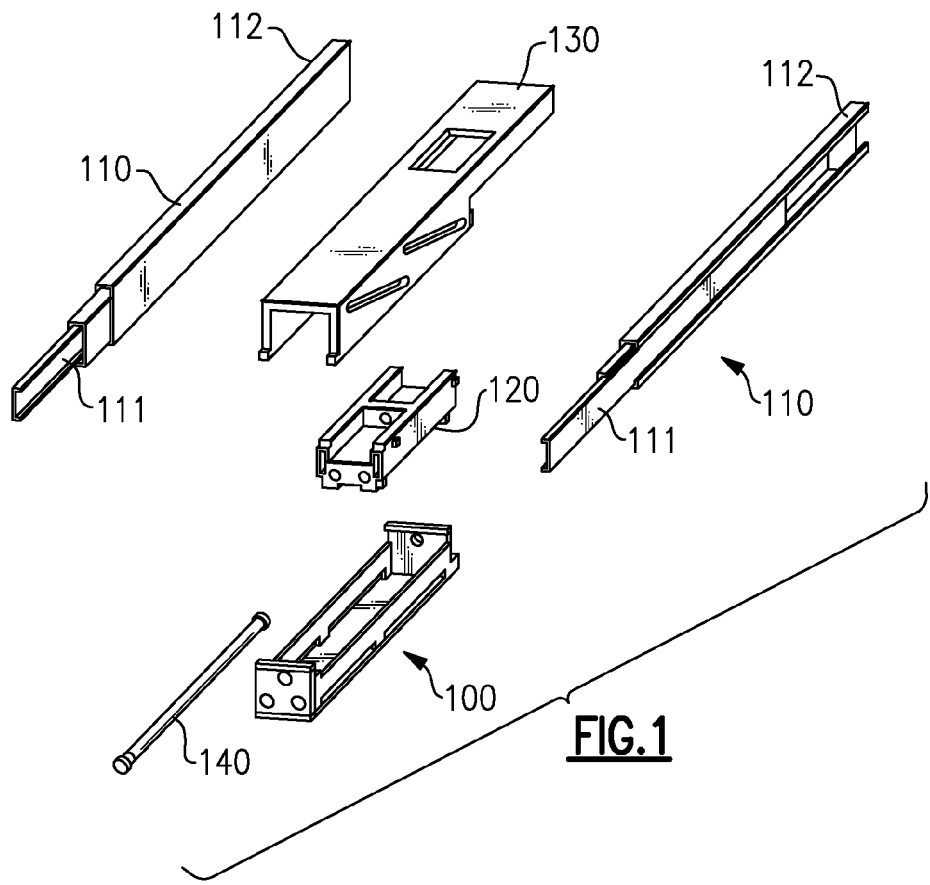
FIG. 1 is an exploded view of the different components that make up the actuation assembly as per one embodiment of the present invention.

FIGS. 1 through 6 provide an actuation assembly as per one embodiment of the present invention. Before discussing additional details pertaining to the present invention, it should be noted that the many advantages of the present invention will become more apparent by referring to co-pending applications Ser. No. 11/262051 and Ser. No. 11/262050. Co-pending application Ser. No. 11/262051 addresses provides for an quick and flexible assembly to which the present invention's actuation assembly can be mounted to further address dynamic loading and heat dissipation concerns, as well as others. In addition, co-pending application, Ser. No. 11/262050, for a cassette assembly that can be mounted inside the packaging assembly of Ser. No. 11/262051 and be further attached to the present invention's actuation assembly to provide additional advantages. It should be noted, however, the while the enumerated co-pending applications were recited to suggest a preferred embodiment for the use of present invention, the teachings of present invention is not limited to the environments and assemblies as suggested by the aforementioned co-pending applications and that the present invention can be implemented separately if desired.

Referring back to the embodiment provided by FIGS. 1 through 6, the actuation assembly provided introduces an improved mechanism that provides for actuation of a high density connector within a desired direction. It should be noted that in many circumstances accommodating a high density connector associated with the electronic cards, specifically logic cards assemblies, lying within a direction that is perpendicular to the insertion direction provides a mechanical challenge to the designers of large systems as discussed. This is because, although blind-docking approaches can seemingly be implemented, but the overall physical size and weight and the nature of the interconnect density of large computing systems, eliminates the feasibility of adopting these approaches.

The name actuation assembly, should not imply an actuation mechanism only, as the assembly provided by the present invention also provides advantages in terms of structural integrity and support, especially when used in conjunction with and for mounting the cassette assembly on the packaging assembly of the previously enumerated inventions. In instances where a rack is used, the present invention provides added structural integrity and support to the entire rack assembly. However, in providing such support the present invention addresses the difficulties associated with service calls that are currently providing challenges to prior art designs.

Structural support and weight increase in large computing environments are inversely related in current prior art systems. While weight management efforts leads to potentially less rigid assemblies, more rigid assemblies often make service calls difficult and costly. One solution addressed by the present invention is to accommodate the needs of servicing field replacement unit (FRU) calls as made by such large computing environments. Servicing of the FRU's within each logic card assembly without the assistance of weight supporting tools will be a great advantage in large system environments.

Ease of serviceability and improved connectability is also enhanced by the present invention by providing a guidance mechanism and an improved mating arrangement. This is especially advantageous in environments where one or more central electronic complexes (CECs) are incorporated into a rack. This is because, in one embodiment of the present invention, the assembly is specially designed for vertical actuation of large logic card entities that are being mated to mid-plane boards of CECs mounted in horizontal positions (in reference to the ground plane). This will also allow for improved thermal management as it provides front to back cooling schemes.

It should also be noted that the figures as will be discussed, illustrate a preferred embodiment of the present invention where large computing environment(s) housing one or more central electronic component (CEC) in a rack are discussed. However, the discussion and figures are only provided for ease of understanding and other embodiments and arrangements can easily be supported by the teachings of the present invention. Thus, present invention should not be limited to those embodiments and figures as will be presently discussed.

Referring back to the figures, FIG. 1 provides for an exploded view of the different components of the present invention. FIG. 1 comprises of a main housing 100, a drive wedge 120, and a lead screw 140. A wedge 130 (also referred to as a first wedge to differentiate it from the drive wedge 120) is also illustrated in FIG. 1. In a preferred embodiment, the wedge 130 will be substantially vertically oriented and therefore the wedge 130 will hereinafter be referred to as vertical wedge 130 since the illustrated figures depict a preferred embodiment, although other wedge orientations can be possible.

Figure 2A:
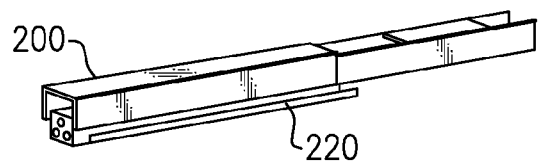
FIGS. 2a and 2b provide an illustration of the components of FIG. 1 once assembled and delineate the telescoping slide feature of the slide mechanism.
Figure 2B:
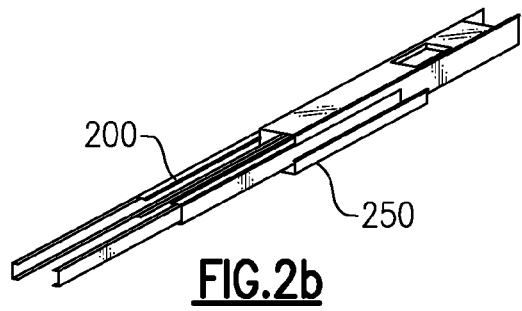

FIG. 1 also illustrates a plurality of slide assemblies or mechanisms 110, hereinafter referred to as slide mechanisms 110. The slide mechanisms, in turn comprise of a sliding body 112 and sliding features 111 engageably slidable within the body 112 (as illustrated) to provide a telescoping feature. In a preferred embodiment, the slide assemblies 110 are symmetrical to one another. The telescoping nature of the slide 110 can be best understood by reference to FIG. 2a and FIG. 2b. In FIG. 2a, a retracted slide view 220 is provided, while FIG. 2b provides for an extended view 250. In one embodiment of the present invention, the telescoping slides 110 also contain multiple détente positions, to provide controlled, predefined deployment positions during servicing of the environment.

It should also be noted that while a variety of materials and processing combinations can be used and employed to fabricated the components illustrated in FIG. 1, in a preferred embodiment, cast and/or machined aluminum or structural polymer, including any required inserts, is used in fabrication of the main housing 100 and vertical and drive wedges 110 and 120. Machined steel can be preferably used for the lead screw and roller ball bearing based custom slide mechanisms.

FIGS. 3 through 6 illustrate the assembly 200 once the different components as shown in FIG. 1 are engaged with one another. In one embodiment of the present invention, the assembly can be mounted to one or more daughter card(s). This is because when using high density, blind-docking connector applications, it is important that one connector element is allowed to float to find its mating half. Since the mother board(s) in large environments is usually fixed, the floating member is often the right angle daughter card. Mounting the assembly 200 to the daughter card also minimizes system level costs of the environment by employing a "pay as you add" burden philosophy. In this way, a fully populated configuration is not required, regardless of the number of daughter cards installed.

FIGS. 3a and 3b provides a more detailed view of the assembly after the different components as shown in FIG. 1 are engaged. As illustrated in FIGS. 3a and 3b, the main housing and the vertical wedge are complementarily engaged with the sliding mechanism being engaged on their adjacent sides. The lead screw 140 is also mounted on the vertical wedge 130 as shown.

The telescoping nature of the slide assembly 110 is further shown alongside the movement of vertical wedge, referenced by the arrows marked as 300 in FIG. 3a. The movement of the drive wedge 120 is also illustrated, as referenced by arrows 350 in FIG. 3b.

FIG. 4, further enhances the illustration of FIGS. 3a and 3b by providing the details of the actuation dwell feature. As shown in the figures, the main housing 100, in one embodiment of the invention, supports the drive wedge 120 and mates to pin retention features on the mid-plane enabling the controlled docking of the node as previously discussed. To address the aforementioned connector "float to dock" requirement, the main housing 100 of the actuator assembly 200 is pinned and not positively clamped to the mid-plane board, thereby allowing the node to shift lightly as the connector alignment features engage. The mid-plane pin engagement locations are illustrated in FIG. 4 at 410.

To accomplish these tasks the vertical wedge and/or the housing are formed such that they accommodate a connector system 400 as shown in FIG. 4. A variety of different connector systems can be conceived as appreciated by a person skilled in the art. In the embodiment that is illustrated, however, the connector system 400 comprises of a pin and hole feature 401 and 402 respectively. In the embodiment shown in the figures, the amount of movement of the dwell feature is dependent on the pin and hole relationship of the housing 100 and wedge 130.

To understand the dwell feature of the assembly, FIGS. 3a, 3b and 4 will now be discussed in connection to one another. As was shown in FIGS. 3a and 3b, the drive wedge 120 is designed to move from one a first position to a second position, such as move front to back, via the lead screw 140 and works with the vertical wedge 130 to provide the actuation movement and travel. In a preferred embodiment, friction control for the wedges 120 and 130, are implemented in the form of roller cam followers, bronze followers or pins (of round, square or some such cross-section) alternatively. A tool actuated lead screw, preferably, provides the force to move the mechanism and travels to a stop position (a down stop in the figures) housed either at the node/mid-plane interface or within the dwell feature defined in the vertical wedge 130. In doing so, the mechanism ensures a controlled contact wipe of the connector system 400 is implemented. In one embodiment, the mechanism can be selectively tuned by introducing the dwell or flat spot in the wedge and thus eliminating the advancement of the travel in that direction (i.e. vertical direction in the figures). This is done while providing tactile feed back to indicate full connector engagement. In addition, upon reaching the down stop, in this embodiment, the mechanism has a positive torque without transmitting load into either the connector system or the mother or daughter boards.

Figure 5:
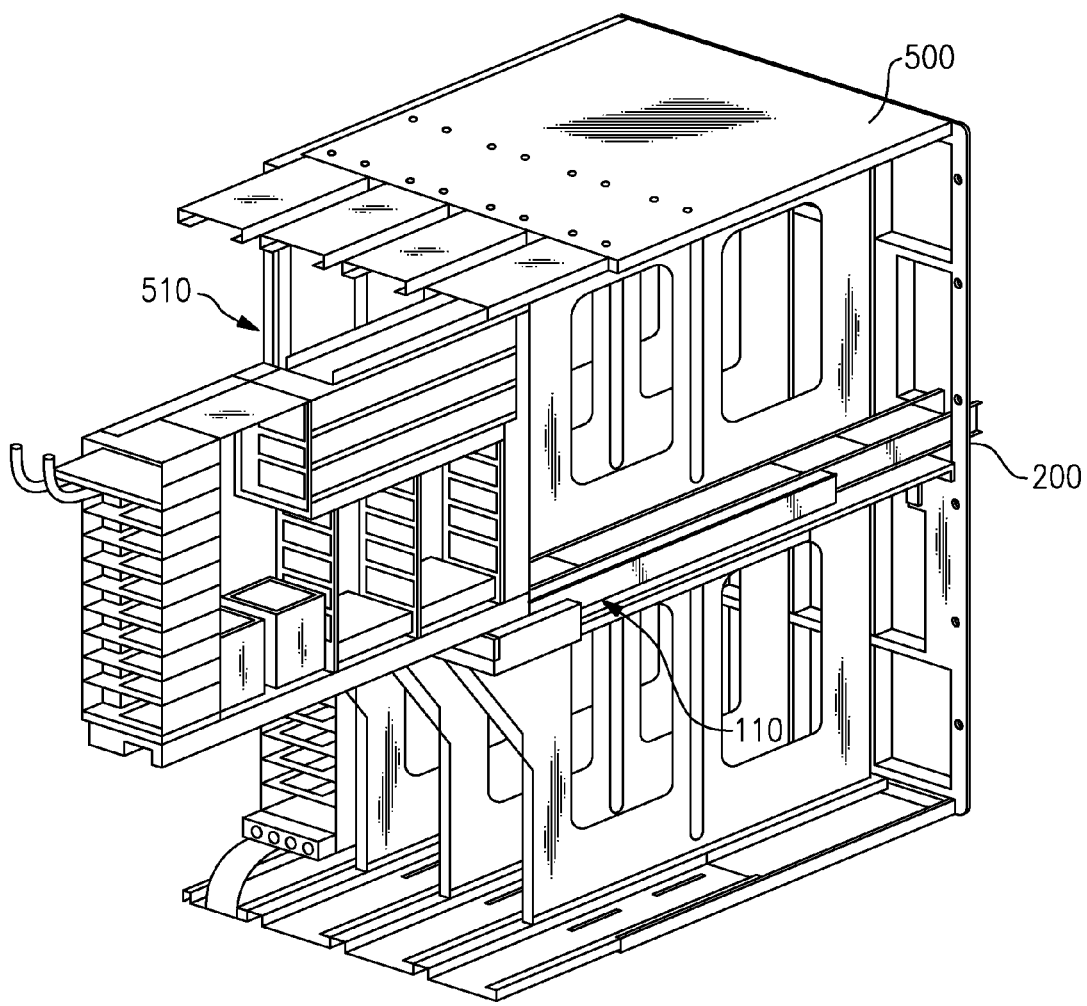
FIG. 5 is an illustration of the outrigger and slide features of the assembly as per one embodiment of the present invention.

FIG. 5 provides for an illustration of the assembly 200 into a rack or housing assembly 500 that houses one or more electronic components housed on logic cards, in an environment that includes at least one CEC. Telescoping feature of the slide mechanism 110 is also illustrated. One intent in providing the illustration of FIG. 5 is to provide better detail as with regards to structural support means incorporated between the logic card assembly and CEC assembly, to facilitate logic card installation and servicing. Specifically, to eliminate lift and support field tools used during logic card servicing and internal pluggable FRU replacement, the assembly 200 incorporates ball bearing (rigid, or some such configuration) slides enabling the deployment of the logic card assembly out of the CEC enclosure. As noted in the previous discussion and in accordance to FIG. 5, the slide mechanisms 110 can incorporate détente features to provide multiple, controlled deployment positions during servicing as desired.

In addition, the slide mechanisms 110 provide additional support and control with the employment of logic card based features, especially when engaged with the outrigger u-channels 510 of CEC top and bottom plates when used with the assembly of the previously enumerated application Ser. No. 11/262,051.

In one embodiment of the present invention, the fixed portion of each slide 110 is attached to vertical wedge 130 and the sliding members 111 are attached to the node (not shown). Positional stops and détente features are incorporated into the custom outrigger 510 to control the deployment distance as well. The outrigger also provides additional telescopic movement and support to the slide mechanisms 110 when the node is fully deployed for FRU servicing (especially intra-logic FRU servicing). In one embodiment, the outriggers 510 can assist in cable management as well by facilitating temporary and/or permanent support for cables during shipping, normal system operation of the environment and/or logic card servicing.

Figure 6:
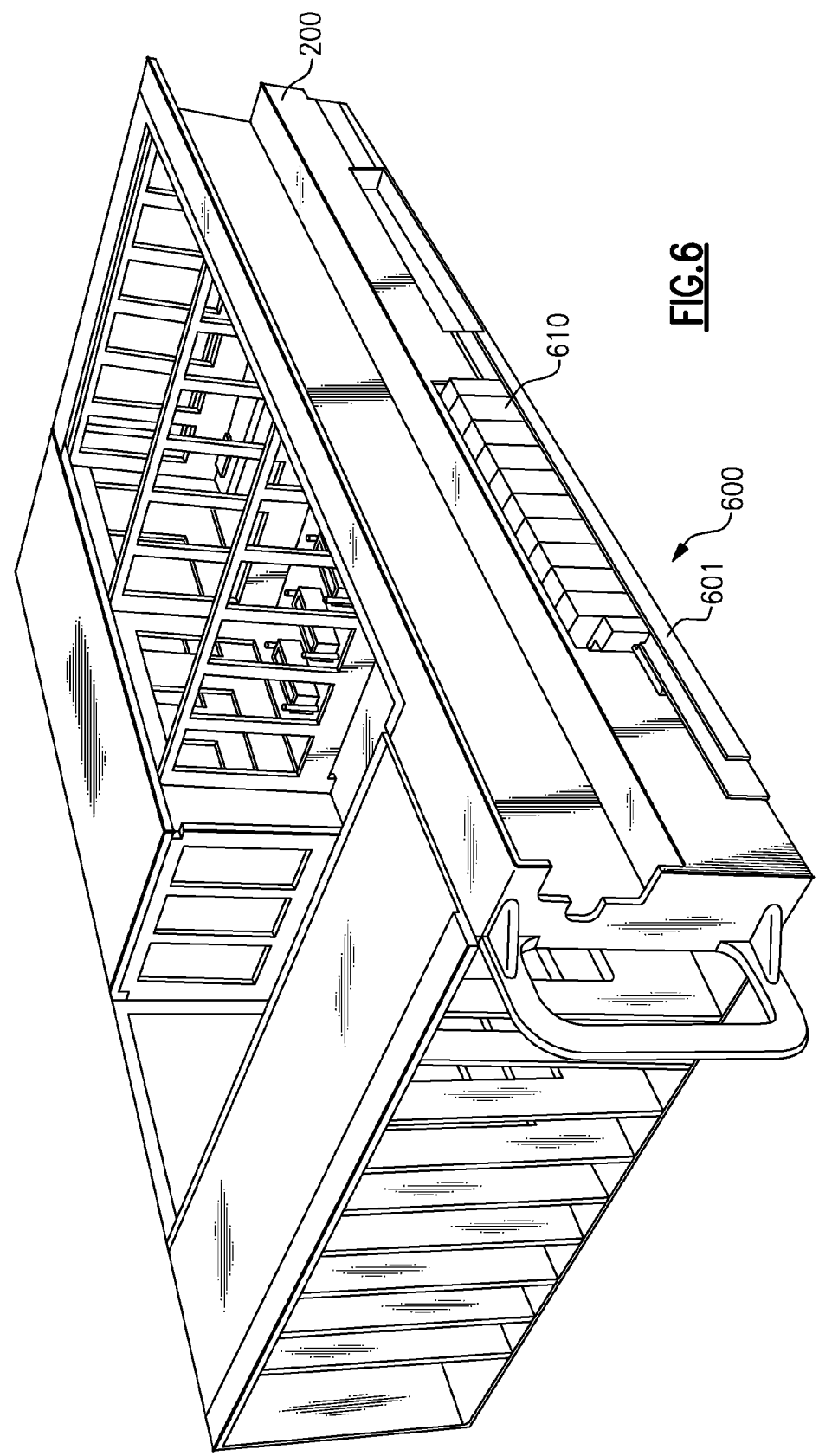
FIG. 6 provides an illustration of an alternate embodiment of the present invention having a stiffening member incorporated into its design.

FIG. 6 provides for an alternate embodiment of the present invention where additional supporting and stiffening features are connected to the assembly 200. As illustrated in FIG. 6, the stiffening and support structure 600 can be incorporated in areas surrounding the surface-mount interconnect, such as the mid-plane connector area 610. The stiffening member 600 can be fastened such that in surrounds connector on the daughter card and provides attachment to the assembly 200. In addition guidance mechanism 601 can also be provided to provide a better connection and mating of (daughter board) logic cards as illustrated.

The stiffening member 600 minimizes or entirely eliminates potentially damaging strains on the logic cards where the electronic components reside and the daughter board connector solder-attached interface.

Many materials and fabrication schemes are available for the stiffening member 600 as known by those skilled in the art. However, in a preferred embodiment, the stiffening member 600 is formed from a cast or machined metal or metallic molded polymer.

Now that the figures are discussed individually, the key features of the assembly 200 will be discussed in general with respect to all the figures. As provided the approach provided by the assembly 200 provides for an integrated outrigger mechanism enabling the removal of the mid-plane, where used, in the field without the removal of the nodes or pluggable FRUs within them (FIGS. 5 and 6). The assembly also provides for a means to smoothly guide support and actuate large daughter card assemblies relying only on the specified characteristics (gatherability) of the interconnect system (FIGS. 4 through 6). The mechanism incorporates a dwell and integrated positional (downstop) feature minimizing adverse mechanical effects to the interconnect system both during and after mating and even during transportation and shipping of any computing environment such as the ones provided in a rack system. In addition, the mechanisms provided in the assembly 200 provide for additional structural support, especially to the SMT connector, whereby minimizing dangerous mechanical strains on the connector during actuation. In addition, the assembly provides the means to replace worn or damaged slides or actuators without removing the mid-plane board.

In one embodiment, the assembly 200 also provides for a pinned approach that facilitates a floating actuation effect, whereby allowing the assembly 200 to be resident on a daughter card rather than its mating mid-plane board. This feature focuses any cost burden to the daughter card which in turn minimizes impact to non-fully populated system configuration in a computing environment.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. An actuation assembly provided for mating electronic unto a computer rack, comprising:
   a main housing engageably securable to a slide assembly;
   said slide assembly capable of being secured to a side of said computer rack and having sliding features such that said slide assembly and said main housing when engaged can be telescoped out or returned to a closed position;
   said main housing having a vertical wedge for securing said assembly to said rack more securely and a drive wedge for moving said vertical wedge such that it can telescope into and out of said rack with said slide mechanism via a lead screw wherein said assembly is mounted to a side of said rack such that said slide mechanism can be extended out from said rack to be connected to an electronic card.

2. The assembly of claim 1, wherein of said slide mechanisms further comprises:
   a fixed housing engageable to said sliding features.

3. The assembly of claim 2, wherein said slide mechanism includes a ditente feature to provide multiple, controlled deployment position for said assembly.

4. The assembly of claim 3, wherein said fixed housing portion of each slide mechanism is affixed to said wedge.

5. The assembly of claim 4, wherein said assembly includes connectors to connect to a computer rack housing electronic components installed on a mother board and a daughter board.

6. The assembly of claim 5, wherein said rack houses one or more central electronic complexes (CECs) and includes at least a mid-plane.

7. The assembly of claim 6, wherein said main housing includes mating components for mating to pin retention features on said mid-plane.

8. The assembly of claim 2, wherein said vertical wedge and said housing are formed such that they accommodate a connector system, said connector system further comprising of a pin and hole feature respectively such as to provide a dwell feature.

9. The assembly of claim 8, wherein said amount of movement of said dwell feature can be selectively altered by said pin and hole relationship.

10. The assembly of claim 1, wherein said assembly is formed from cast or machined aluminum.

11. The assembly of claim 1, wherein said assembly is formed from structural polymer.

12. The assembly of claim 1, wherein said assembly is fabricated out of structural polymer.

13. The assembly of claim 2, wherein said slide mechanism further comprise a lead screw and roller ball bearing.

14. The assembly of claim 13, wherein said slide mechanism is formed from machined steel.

15. The assembly of claim 6, further comprising a surface mount interconnect feature is provided to connect said assembly to a mid-plane connector of a computing environment, and at least one stiffening member attached to said surface-mount interconnect, such as that said stiffening member is also fastened to a connector on a logic card residing in said computing environment.

16. The assembly of claim 15, wherein a guidance mechanism is provided to enhance connection and mating of said logic card to said assembly.

17. The assembly of claim 16, wherein said stiffening member is formed from a cast or machined metal or metallic molded polymer.

* * * * *